United States Patent
Wei et al.

(10) Patent No.: US 10,139,723 B2
(45) Date of Patent: Nov. 27, 2018

(54) METHOD OF FORMING PHOTOMASK

(71) Applicant: UNITED MICROELECTRONICS CORP., Hsin-Chu (TW)

(72) Inventors: Chih-I Wei, Taichung (TW); Chia-Wei Huang, Kaohsiung (TW); Yung-Feng Cheng, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 82 days.

(21) Appl. No.: 15/361,007

(22) Filed: Nov. 24, 2016

(65) Prior Publication Data

US 2018/0143529 A1    May 24, 2018

(51) Int. Cl.
  *G06F 17/50*    (2006.01)
  *G03F 1/36*    (2012.01)
  *G03F 1/84*    (2012.01)

(52) U.S. Cl.
  CPC .................. *G03F 1/36* (2013.01); *G03F 1/84* (2013.01); *G06F 17/5081* (2013.01)

(58) Field of Classification Search
  CPC .............................. G06F 17/5081; G03F 1/36
  See application file for complete search history.

(56) References Cited

U.S. PATENT DOCUMENTS

| 7,424,699 B2 | 9/2008 | O'Brien |
| 8,826,198 B2 | 9/2014 | Tsai |
| 2009/0202923 A1* | 8/2009 | Takeuchi ................. G03F 1/36 430/5 |
| 2014/0331191 A1 | 11/2014 | Wu |

* cited by examiner

*Primary Examiner* — Vuthe Siek
(74) *Attorney, Agent, or Firm* — Winston Hsu (57) ABSTRACT

A method of forming a photomask is provided. A first layout pattern is first provided to a computer system and followed by generating an assist feature pattern by the computer system based on the first layout pattern and adding the assist feature pattern into the first layout pattern to form a second layout pattern. Thereafter, an optical proximity correction process is performed with reference to both the first layout pattern and the assist feature pattern to the second layout pattern without altering the assist feature pattern to form a third layout pattern by the computer system. Then, the third layout pattern is output to form a photomask.

16 Claims, 11 Drawing Sheets

METHOD OF FORMING PHOTOMASK

BACKGROUND OF THE INVENTION

1. Field of the Invention

The present invention relates to a method of forming a photomask, and more particularly to a method of forming a photomask including an optical proximity correction process with adding the assist feature pattern.

2. Description of the Prior Art

With the trend of miniaturization of electronic products and peripheral devices, research for thin structures and high integration of semiconductor devices has become a main concern in the industry. Lithography technology plays an important role in determining the performance of semiconductor devices.

In a semiconductor manufacturing process, the integrated circuit layout is first designed and formed as a photomask pattern. The photomask pattern is then proportionally transferred to a photoresist layer disposed on the semiconductor wafer through an exposure process followed by a development process, so that a photoresist pattern with the integrated circuit layout on the semiconductor wafer is formed. Subsequently, a corresponding etching process is performed to transfer the photoresist pattern to the semiconductor wafer so as to manufacture the semiconductor devices. As the line width of the integrated circuit shrinks to be less than half the wavelength of light used in the exposure process, diffraction and interference of the light will occur, which results in deviations in the transferred pattern such as rounded right-angle corners, shortened line-ends, or increase/decrease of line widths. This phenomenon is also called the optical proximity effect (OPE).

To overcome the above problems, an optical proximity correction (OPC) process is developed to change each pattern of the photomask pattern, so that the transferred pattern may be more like the required integrated circuit layout. However, when the critical dimension is less than 65 nm, depth of focus of the lithography process is rapidly reduced. Accordingly, assist features such as dummy patterns or scattering bars are developed to be added to the photomask pattern through performing an optical simulation and disposed between the layout patterns of the original photomask pattern, for reducing the risk of deformation of the transferred pattern on the semiconductor wafer. However, when the pattern of the original photomask pattern is symmetric, the assist features generated by the optical simulation are usually asymmetric, which would cause difficulty to inspect a defect on the formed photomask and difficulty to verify the accuracy of the formed semiconductor devices on the semiconductor wafer. In the inspection of the defect of the formed photomask, two areas with the same pattern are compared, and if they are different, the defect can be found. However, when the assist features are not symmetric, it is easily to find two different patterns, but they may be correct, thereby increasing the difficulty of the inspection. Also, in the verification of the semiconductor devices, when the assist features are not symmetric, the intensity of light passing two different areas may be different, so that it is not easily to confirm if the semiconductor devices in the different areas are correct. Accordingly, a way to form a symmetric assist feature pattern to ease the inspection of the defect of the photomask and the verification of the semiconductor wafer is an important issue in the field.

SUMMARY OF THE INVENTION

An objective of the present invention is therefore to provide a method of forming a photomask that make the inspection of a defect on the formed photomask and the verification of the accuracy of the formed semiconductor devices on the semiconductor wafer more easily.

According to an embodiment of the present invention, a method of forming a photomask is provided and includes the following steps. First, a first layout pattern is provided to a computer system and followed by generating an assist feature pattern by the computer system based on the first layout pattern and adding the assist feature pattern into the first layout pattern to form a second layout pattern. Thereafter, an optical proximity correction process is performed with reference to both the first layout pattern and the assist feature pattern to the second layout pattern without altering the assist feature pattern to form a third layout pattern by the computer system. Then, the third layout pattern is output to form a photomask.

In the method of forming the photomask of the present invention, the symmetric assist feature pattern is generated in the second layout pattern, and the assist feature pattern is not altered during the OPC process, so that the assist feature pattern can be still symmetric. Accordingly, the inspection of a defect on the formed photomask and the verification of the accuracy of the formed semiconductor devices on the semiconductor wafer can be easily done.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
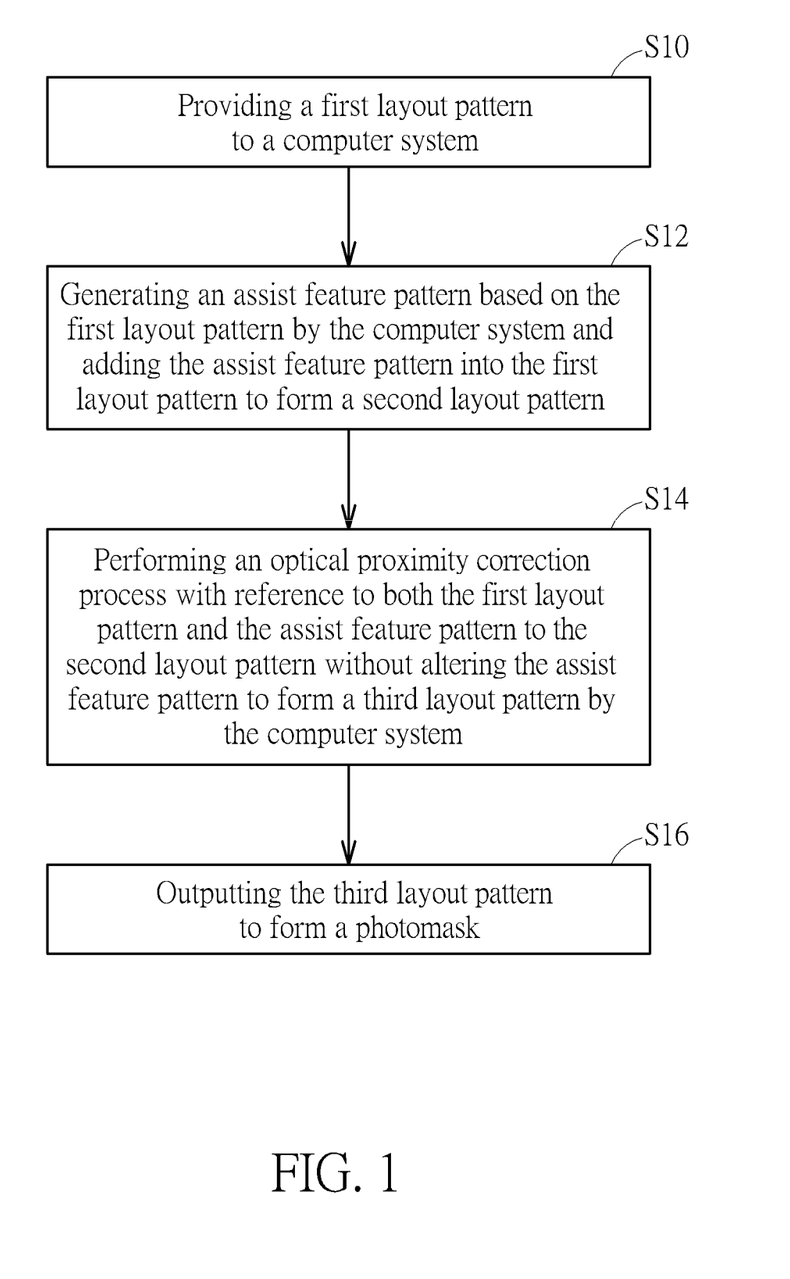
FIG. 1 is a flowchart of a method of forming a photomask according to one embodiment of the present invention.
Figure 2:
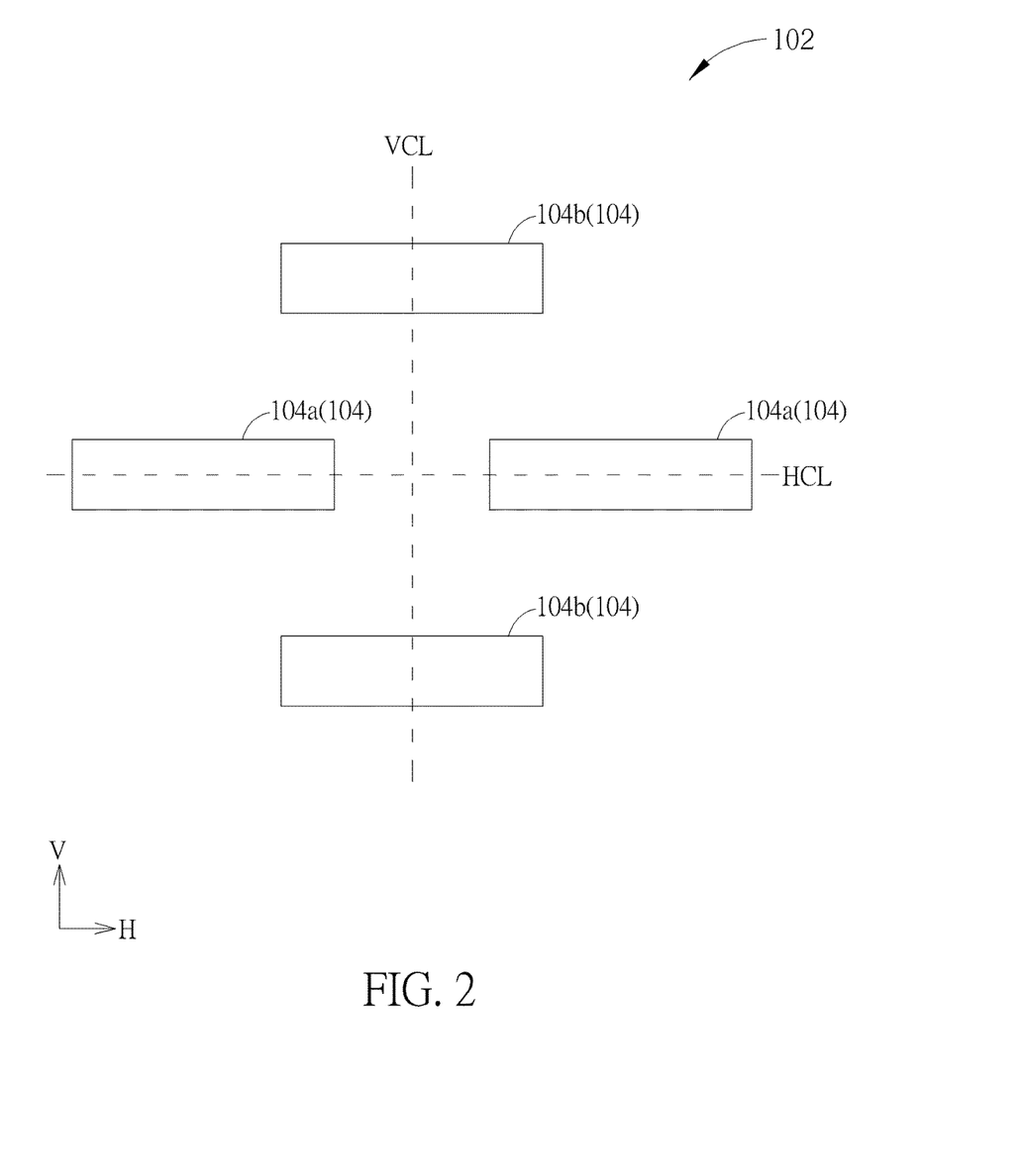
FIGS. 2-12 are schematic diagrams illustrating the method of forming the photomask according to the first embodiment of the present invention.

Refer to FIG. 1 as well as FIGS. 2-12. FIG. 1 is a flowchart of a method of forming a photomask according to one embodiment of the present invention, and FIGS. 2-12 are schematic diagrams illustrating the method of forming the photomask according to the first embodiment of the present invention, in which FIGS. 3-10 are schematic diagrams illustrating a method of generating an assist feature pattern. As shown in FIG. 1 and FIG. 2, in step S10, a first layout pattern 102 is provided to a computer system. The first layout pattern 102 includes a plurality of patterns 104, which is an ideal pattern supposed to be later transferred on a mask or a material layer such as a photoresist layer on a semiconductor wafer. The patterns 104 are printable patterns used to construct integrated circuits (IC) such as doped region patterns, device patterns, or layout of circuits. In this embodiment, the patterns 104 are symmetric with respect to a horizontal center line HCL and a vertical center line VCL of the first layout pattern 102. For example, in a method for manufacturing a static random access memory (SRAM) device, each pattern 104 may be rectangular, a length of each pattern 104 in a horizontal direction H is larger than a width of each pattern 104 in a vertical direction V, and the patterns 104 are arranged as a plurality of mutually staggered rows. In another embodiment, each pattern 104 may be other polygonal shape. For clarity, only four symmetric patterns 104 adjacent to each other are shown in FIG. 2, but not limited thereto. The four patterns 104 shown in FIG. 2 may be regarded as a unit, and the first layout pattern 102 may include a plurality of the units, in which adjacent rows of the units may be staggered. The four patterns 104 are taken as an example in the following description, but the present invention is not limited thereto. Specifically, the four patterns 104 may be divided into two first patterns 104a and two second patterns 104b, in which the first patterns 104a are arranged along the horizontal direction H and between the second patterns 104b, and the second patterns 104b are arranged along in the vertical direction V and overlap both the first patterns 104a in the vertical direction V. More specifically, centers of the second pattern 104b and a center of a gap between the first patterns 104a are arranged in a line along the vertical direction V.

Figure 11:
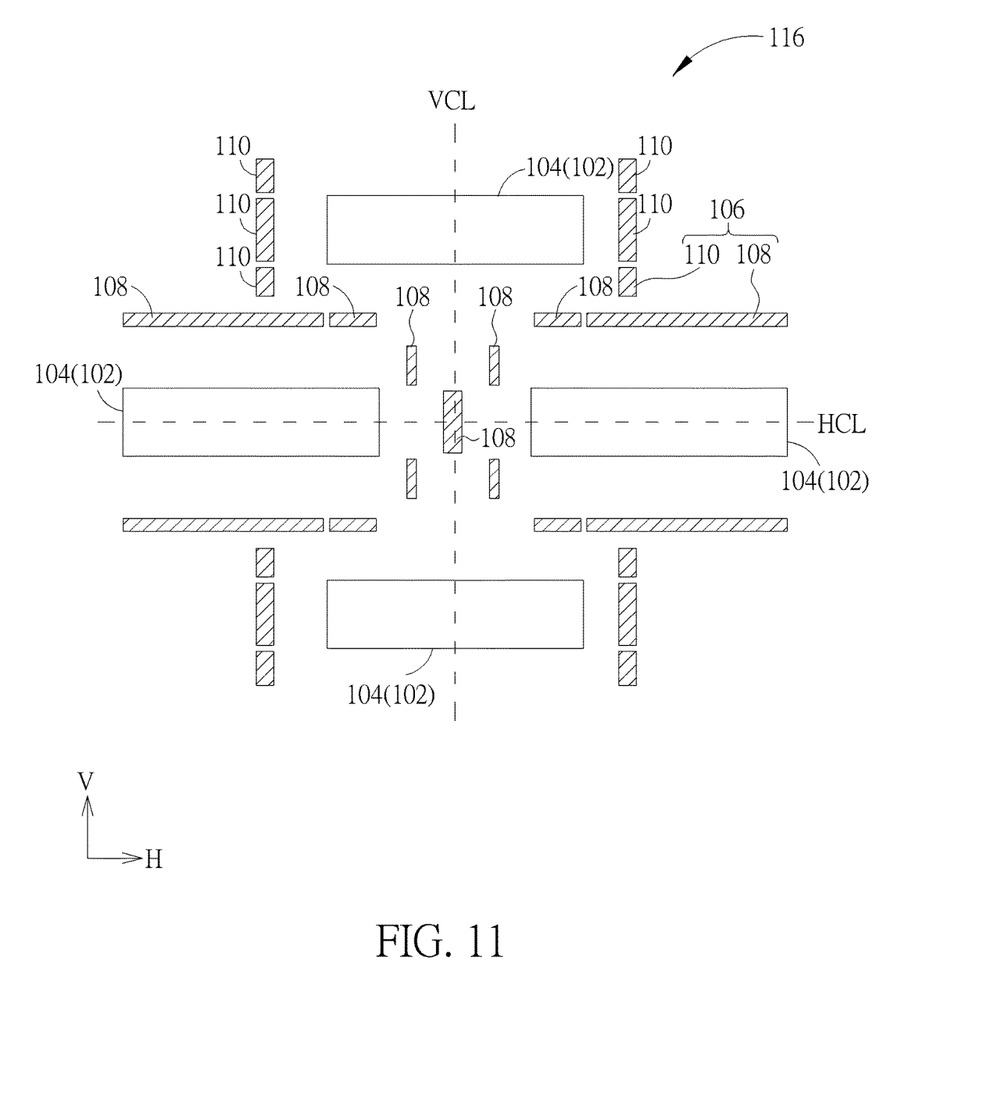

As shown in FIG. 11, in step S12, after the first layout pattern 102 is provided, an assist feature pattern 106 is generated by the computer system based on the first layout pattern 102, and the assist feature pattern 106 is inserted into the first layout pattern 102 to form a second layout pattern 116. The assist feature pattern 106 includes a plurality of first assist features 108 and a plurality of second assist features 110, in which each of the first assist features 108 is disposed between any two of the patterns 104 adjacent to each other, and each of the second assist features 110 is disposed at an outside of the first layout pattern 102 respectively. In this embodiment, a pattern formed by the first assist features 108 and the second assist features 110 are symmetrical with respect to the vertical center line VCL and the horizontal center line HCL crossing a center of the first layout pattern 102. The first assist features 108 and the second assist features 110 are non-printable features; more specifically, when the photomask including the first layout pattern 102 and the assist feature pattern 106 is used in a lithography process performed on a light-sensitive material layer on the semiconductor wafer, only the patterns corresponding to the first layout pattern 102 can be formed on the material layer, and the patterns corresponding to the assist feature pattern 106 will not be formed on the light-sensitive material layer.

Figure 3:
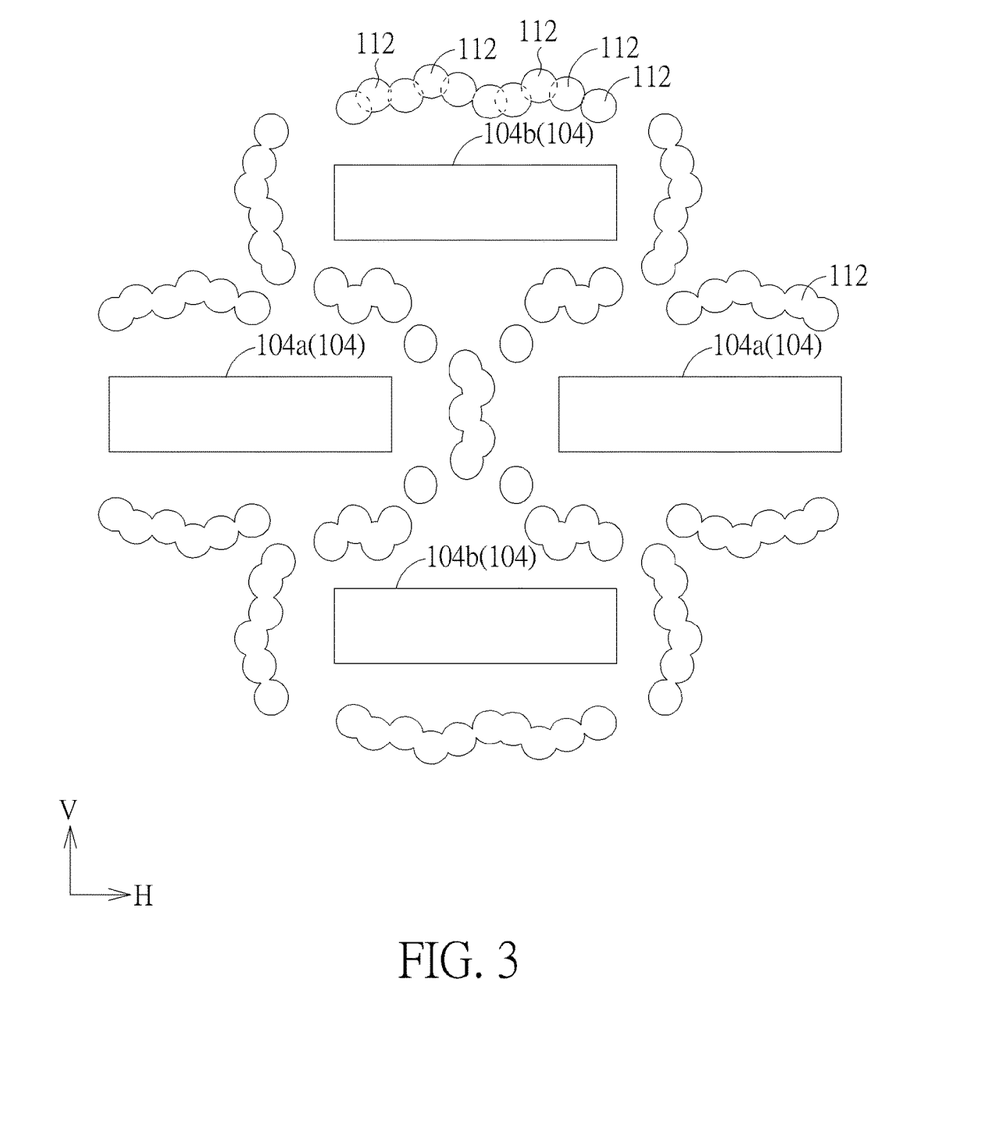

The following description further details the formation of the symmetric assist feature pattern. As shown in FIG. 3, first, the computer system generates a plurality of assist feature seeds 112 by performing an optical simulation step based on the first layout pattern 102, and the assist feature seeds 112 are inserted into the first layout pattern 102. The optical simulation step is to simulate light passing through the first layout pattern 102 onto the semiconductor wafer so as to find where the largest intensity of light is, and generate and insert the assist feature seeds 112 to areas that has the largest intensity of light. Thus, pattern density of the first layout pattern 102 inserted with the assist feature seeds 112 can be made uniform, and the light intensity distribution can be equalized. After the optical simulation step, the assist feature seeds 112 are inserted into the first layout pattern 102. In this embodiment, the assist feature seeds 112 substantially surround each of the patterns 104, but not limited thereto. For example, each of the assist feature seeds 112 may be smaller than each of the patterns 104, and may be circle or other shapes, but not limited thereto. The assist feature seeds 112 may be divided into several parts, and the neighboring assist feature seeds 112 in each of the parts may be connected to each other. The size, the shape, the quantity and the arrangement of the assist feature seeds 112 can be modified according to process requirements. Those skilled in the art should know the optical simulation step may use an optical model, such as SPLAT, Calibre nmSRAF tool or other kinds of software, stored in the computer system, to simulate the light intensity distribution and generate the assist feature seeds 112. The assist feature seeds 112 may be also called the Model-based assist feature. Additionally, the size range and the arrangement of the assist feature seeds 112 may obey the rules of the assist feature process rule check (PRC) such as limitation of the critical dimension and the critical space. In one embodiment, a width of each of the assist feature seeds 112 is smaller than a specific value, i.e. the maximum size of patterns in the photomask which cannot be resolved through the lithography process, and larger than the photomask manufacturing limit of the corresponding tool, i.e. the minimum size of patterns which can be formed in the photomask by a tool for manufacturing the photomask. More specifically, for a semiconductor process having critical dimensions of 20 nanometers (nm), the maximum size of the patterns in the photomask which cannot be resolved is substantially around 32 nm, and the photomask manufacturing limit is substantially around 13 nm. Accordingly, the width of each assist feature seed 112 is substantially between 13 nm and 32 nm, but not limited thereto. It should be noted that since the assist feature seeds 112 are generated by the optical simulation, the distribution of the assist feature seeds 112 is not regular and would be changed with the position and disposed direction of the first layout pattern 102. Thus, if the first layout pattern 102 inserted with the assist feature seeds 112 is directly used to form a photomask, uncertainty and non-consistency of the formed photomask would be generated, and the asymmetry of the assist feature seeds 112 still exists. To avoid that, the following steps are further performed in this embodiment.

Figure 4:
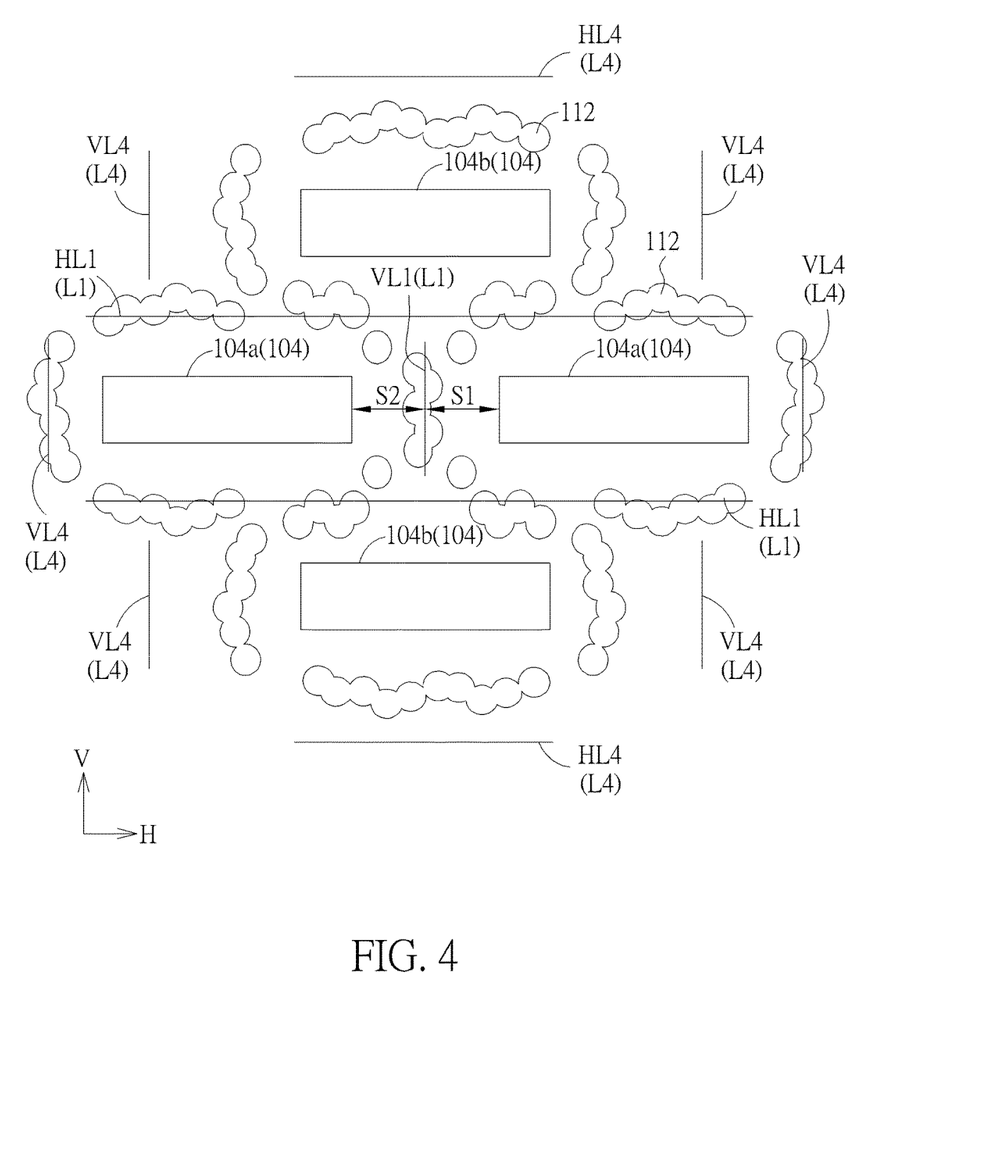

As shown in FIG. 4, after the assist feature seeds 112 are generated, a center line generation is performed to generate a plurality of first lines L1 and a plurality of fourth lines L4 by the computer system based on the first layout pattern 102, and the first lines L1 and the fourth lines L4 are added into the first layout pattern 102. Each of the first lines L1 is respectively disposed at the center of the gap between any two of the patterns 104 adjacent to each other and parallel to sides of the any two of the patterns 104, and a spacing between each of the first lines L1 and one of the any two of the patterns 104 is the same as another spacing between each of the first lines L1 and another one of the any two of the patterns 104. Specifically, each of the first lines L1 having a width less than the size of each of the assist feature seeds 112, such as 5 nm, is generated corresponding to an inner side of each of the patterns 104 and between any two adjacent patterns 104. In this embodiment, the first lines L1 can be divided into one first vertical line VL1 disposed along the vertical direction V and two first horizontal lines HL1 disposed along the horizontal direction H. The first vertical line VL1 is disposed between the first patterns 104a and a length of the first vertical line L1 is larger than that of the corresponding side of each of the first patterns 104a. Also, the first vertical line VL1 doesn't cross the second patterns 104b, and two ends of the first vertical line VL1 are respectively spaced apart from each of the second patterns 104b by a distance. The first horizontal lines HL1 are respectively disposed between one of the second patterns 104b and the first patterns 104a and between the other one of the second patterns 104b and the first patterns 104a. Since a length of each of the first horizontal lines HL1 is larger than that of the corresponding side of each of the second patterns 104b and that of the corresponding side of each of the first patterns 104a, the first horizontal lines HL1 arranged in the same line along the horizontal direction H can be combined to be one first horizontal line HL1.

Additionally, each of the fourth lines L4 is disposed at the outside of the first layout pattern 102, and spaced apart from an outmost one of the patterns 104 by a predetermined distance. In this embodiment, the fourth lines L4 can be divided into six fourth vertical lines VL4 disposed along the vertical direction V and two fourth horizontal lines HL4 disposed along the horizontal direction H. Each of the fourth vertical lines VL4 is respectively generated corresponding to each vertical side of each of the second patterns 104b and the outer vertical side of each of the first patterns 104, and doesn't cross the patterns 104. Each of the fourth horizontal lines HL4 is respectively generated corresponding to the outer horizontal side of each of the second patterns 104b. The predetermined distance may be set according to the design requirements.

Figure 5:
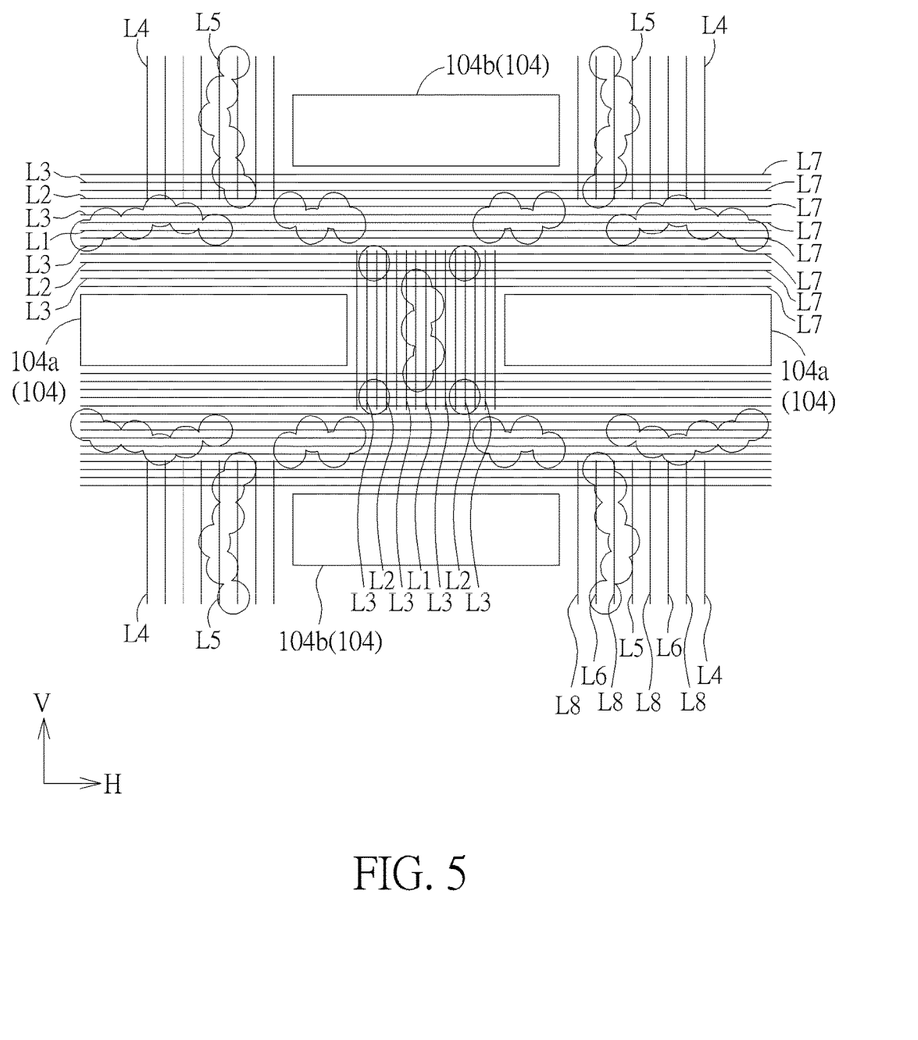

As shown in FIG. 5, another center line generation is then performed to generate a plurality of second lines L2 and a plurality of fifth lines L5, and the second lines L2 and the fifth lines L5 are added into the first layout pattern 102. For clarity, some outer parts are not shown in FIG. 5, but the present invention is not limited thereto. Each of the second lines L2 is disposed at another center of another gap between each of the first lines L1 and a corresponding one of the patterns 104. Also, each of the second lines L2 is parallel to the corresponding first line L1, and the spacing between each of the second lines L2 and the corresponding first line L1 is the same as the spacing between each of the second lines L2 and the corresponding pattern 104. Each of the second lines L2 has the same length and width as the corresponding first line L1, and will not be detailed redundantly. Additionally, each of the fifth lines L5 is disposed at another center of another gap between each of the fourth lines L4 and a corresponding one of the patterns 104 and is parallel to the corresponding fourth line L4, and accordingly, the spacing between each of the fifth lines L5 and the corresponding fourth line L4 is the same as the spacing between each of the fifth lines L5 and the corresponding pattern 104. Each of the fifth lines L5 has the same length and width as the corresponding fourth line L4, and will not be detailed redundantly.

Subsequently, another center line generation is further performed to generate a plurality of third lines L3 and a plurality of sixth lines L6, and the third lines L3 and the sixth lines L6 are added into the first layout pattern 102, in which each of the third lines L3 is respectively disposed at another center of another gap between each of the second lines L2 and a corresponding one of the patterns 104 and another center of another gap between each of the second lines L2 and a corresponding one of the first lines L1, and each of the sixth lines L6 is respectively disposed at another center of another gap between each of the fifth lines L5 and a corresponding one of the patterns 104 and another center of another gap between each of the fifth lines L5 and a corresponding one of the fourth lines L4. The generation of the third lines L3 and the sixth lines L6 is similar to the generation of second lines L2 and the fifth lines L5, so that each of the third lines L3 has the same length and width as the corresponding second line L2, and each of the sixth lines L6 has the same length and width as the corresponding fifth line L5.

In this embodiment, another center line generation may be selectively performed to generate a plurality of seventh lines L7 and a plurality of eighth lines L8, and the seventh lines L7 and the eighth lines L8 are added into the first layout pattern 102, in which each of the seventh lines L7 is respectively disposed at another center of another gap between each of the third lines L3 and a corresponding one of the patterns 104, another center of another gap between each of the third lines L3 and a corresponding one of the second lines L2 and another center of another gap between each of the third lines L3 and a corresponding one of the first lines L1, and each of eighth lines L8 is respectively disposed at another center of another gap between each of the sixth lines L6 and a corresponding one of the patterns 104, another center of another gap between each of the sixth lines L6 and a corresponding one of the fifth lines L5 and another center of another gap between each of the sixth lines L6 and a corresponding one of the fourth lines L4. The generation of the seventh lines L7 and the eighth lines L8 is similar to the generation of the third lines L3 and the sixth lines L6, so that each of the seventh lines L7 has the same length and width as the corresponding third line L3, and each of the eighth lines L8 has the same length and width as the corresponding sixth line L6. According the above-mentioned center line generations, all of the lines are not in contact with the patterns 104, and formed among the patterns 104. It should be noted that the number of the center line generations of this embodiment is four, so that a gap between any two adjacent lines can be smaller than the photomask manufacturing limit, but the present invention is not limited thereto. The center line generations of the present invention should be performed several times until the gap is smaller than the photomask manufacturing limit. The number of the center line generations may be at least three or more.

Figure 6:
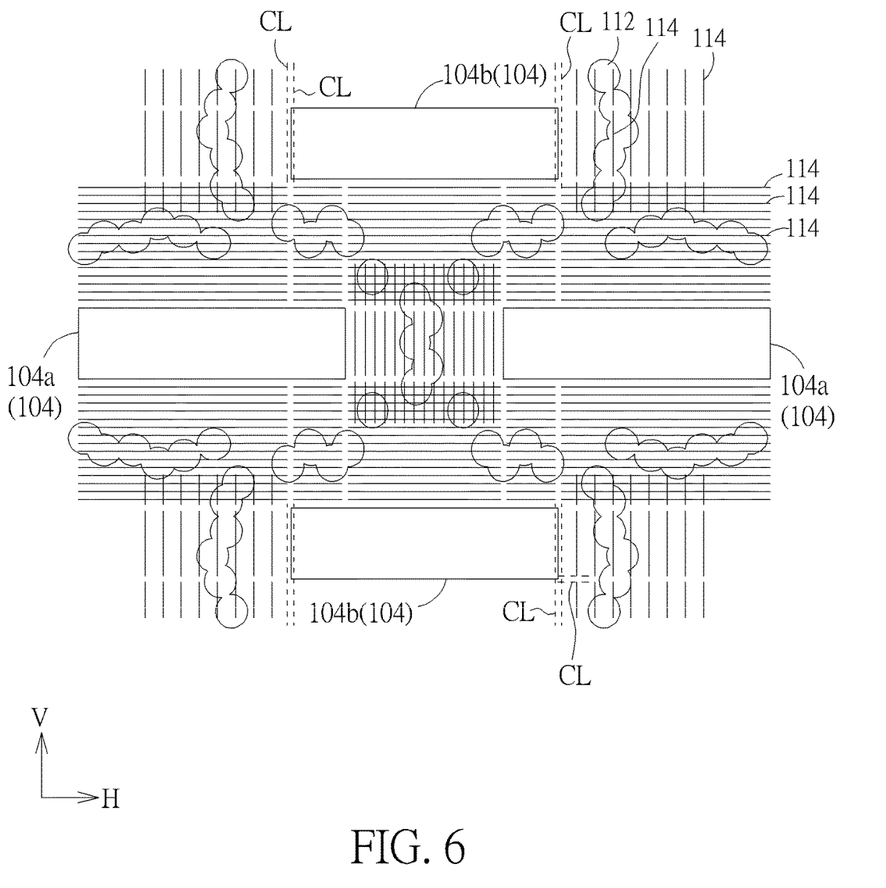
Figure 7:
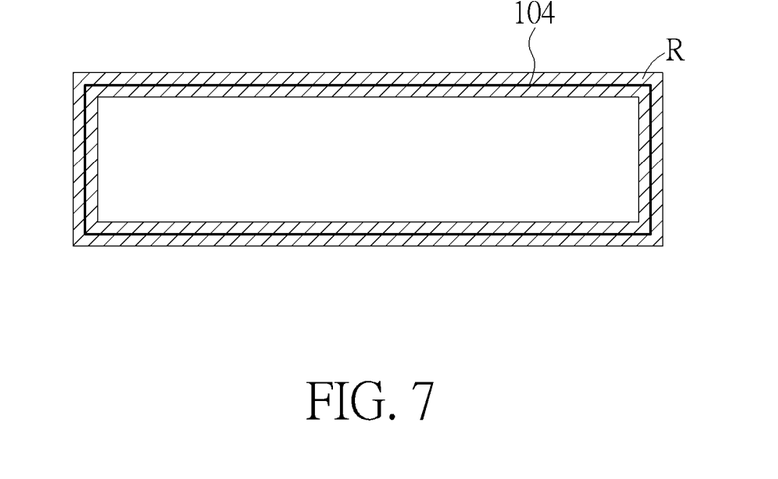
Figure 8:
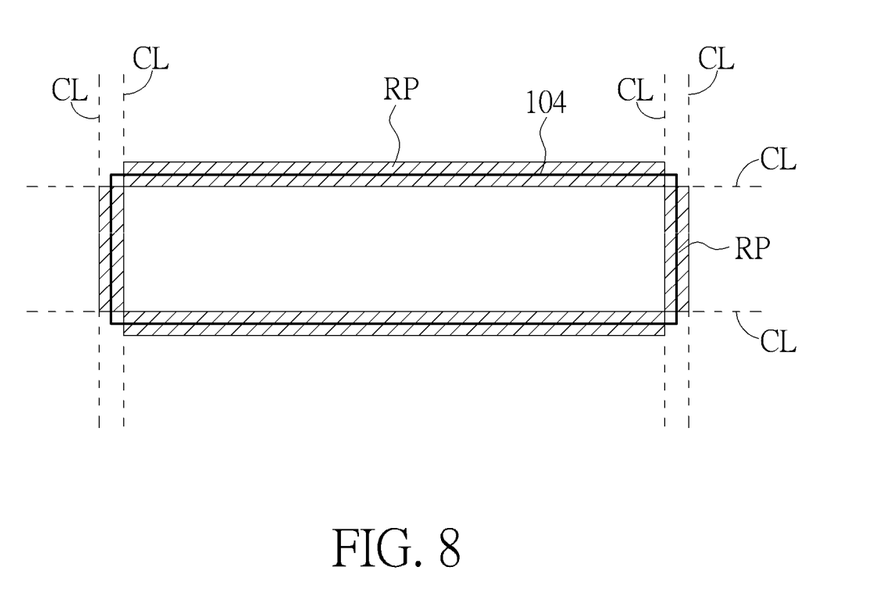

As shown in FIG. 6, the first lines L1, the second lines L2, the third lines L3 and the seventh lines L7 are cut off to form a plurality of line segments 114 based on each of the patterns 104. Specifically, each of the patterns 104 may be used to form a plurality of cutting lines CL. Refer to FIGS. 7-8, which show the steps of forming the cutting lines. As shown in FIG. 7, all sides of each of the patterns 104 may be expanded and shrunk by a predetermined thickness to form two rectangles, and the rectangles can form a rectangular ring R. The thickness of the rectangular ring R is larger than the photomask manufacturing limit, i.e. two times the predetermined thickness should be larger than the photomask manufacturing limit. Then, as shown in FIG. 8, corners of each rectangular ring R are removed to form four rectangular portions RP in each of the patterns 104, and an extension direction of each side of each of the rectangular portions RP is regarded as a cutting line CL. Thereafter, the cutting lines CL can be used to cut off all of the lines formed in the center line generations, and the lines between any two of cutting lines CL formed by the extension directions of the long sides of the same rectangular portion RP are removed, thereby forming the line segments 114. A gap may exist between two adjacent line segments 114 arranged along the same line.

Figure 9:
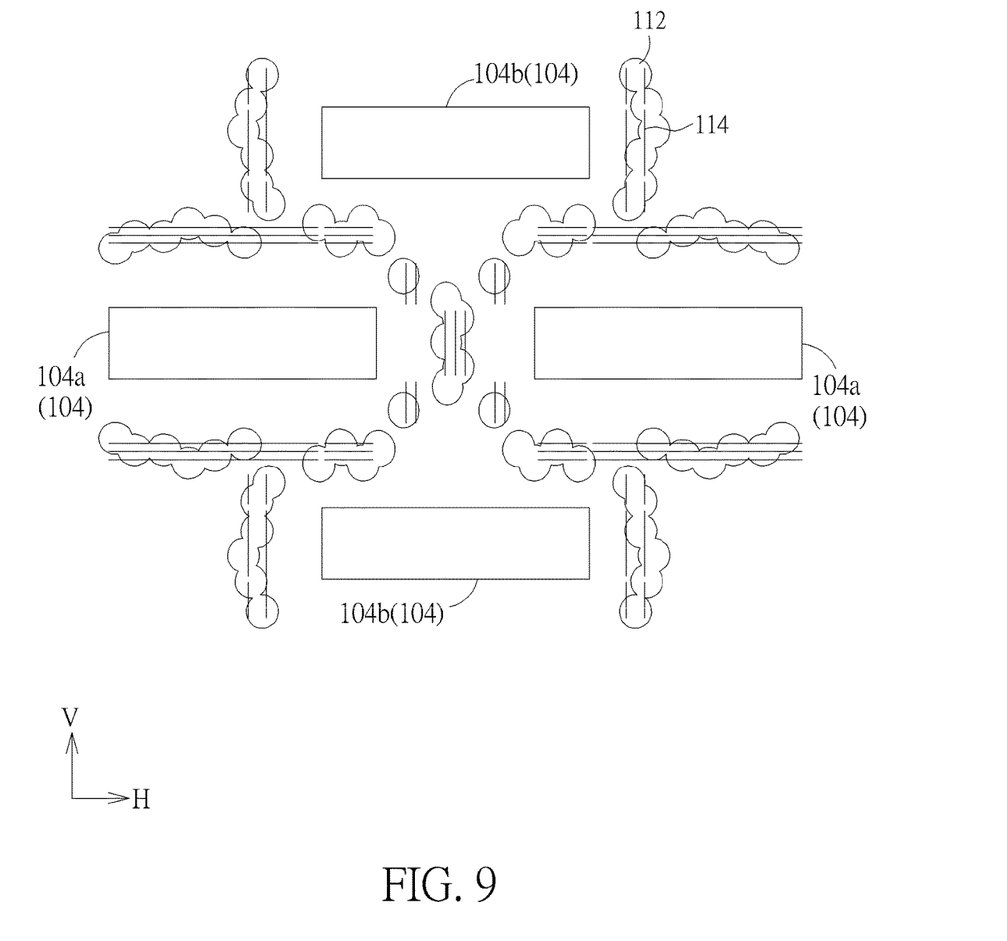

As shown in FIG. 9, after the line segments 114 are formed, a part of the line segments 114 is retained, and other part of the line segments 114 is removed based on a predetermined judgment condition. Specifically, each of the line segments 114 and the assist feature seeds 112 have an overlapping area, and the predetermined judgment condition is based on the size of the overlapping area. For example, the predetermined judgment condition is preferably that when a ratio of the overlapping area to the corresponding line segment 114 is greater than 0.3, the line segment 114 is retained. If the overlapping doesn't comply with the condition, the corresponding line segment 114 is removed. In another embodiment, the judgment condition may be that the overlapping area is ten times greater than a width of the corresponding line segment 114. That is, the overlapping area of each of the retained part of the line segments 114 and the assist feature seeds 112 is ten times greater than the width of the corresponding line segment 114. For example, when a width of each of the line segments 114 is 5 nm, the overlapping area should be greater than 50 nm² while the corresponding line segment 114 is retained.

Figure 10:
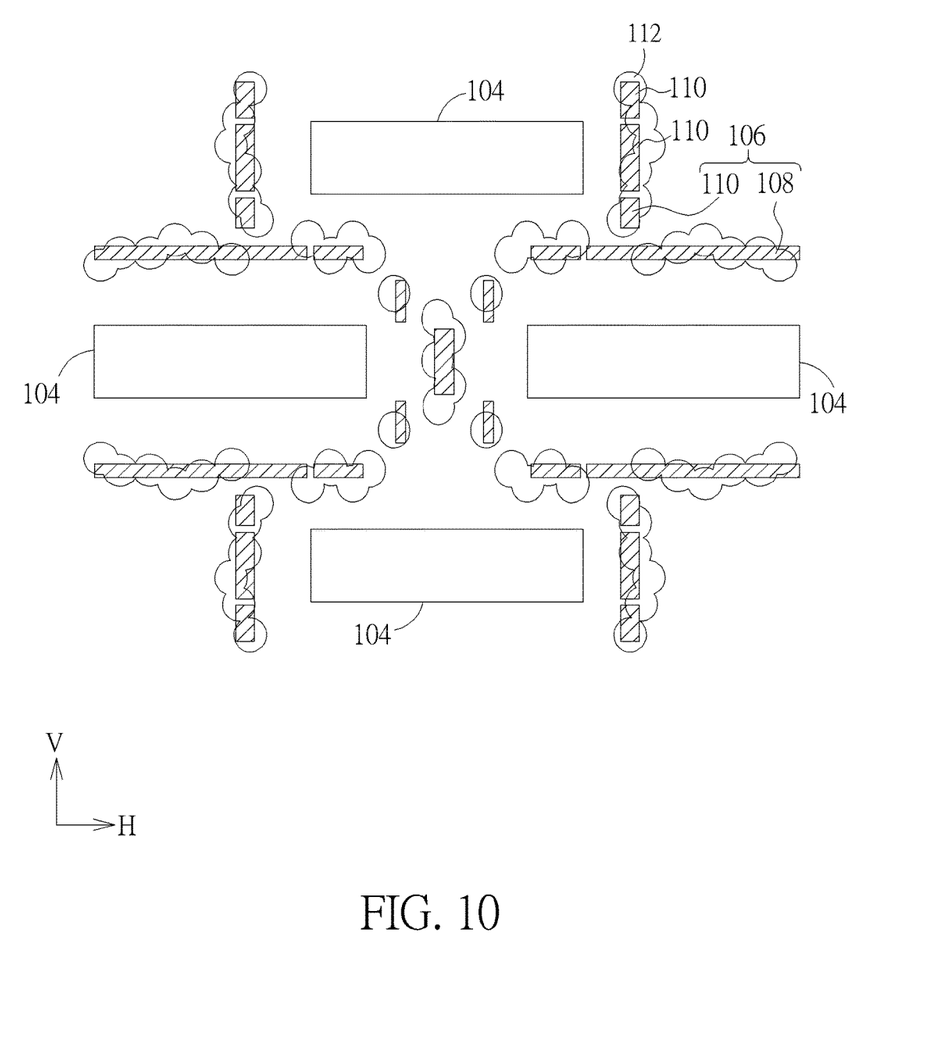

As shown in FIG. 10, subsequently, the retained line segments 114 spaced apart by a distance smaller than the photomask manufacturing limit are merged, and the line segments 114 spaced apart by another distance larger than the photomask manufacturing limit are maintained, thereby forming the assist feature pattern 106 of this embodiment. Following that, as shown in FIG. 11, the assist feature seeds 112 are removed, and the formed assist feature pattern 106 is inserted into the first layout pattern 102 to form the second layout pattern 116. The formed assist feature pattern 106 is symmetric with respect to the horizontal center line HCL and the vertical center line VCL of the first layout pattern 102.

Figure 12:
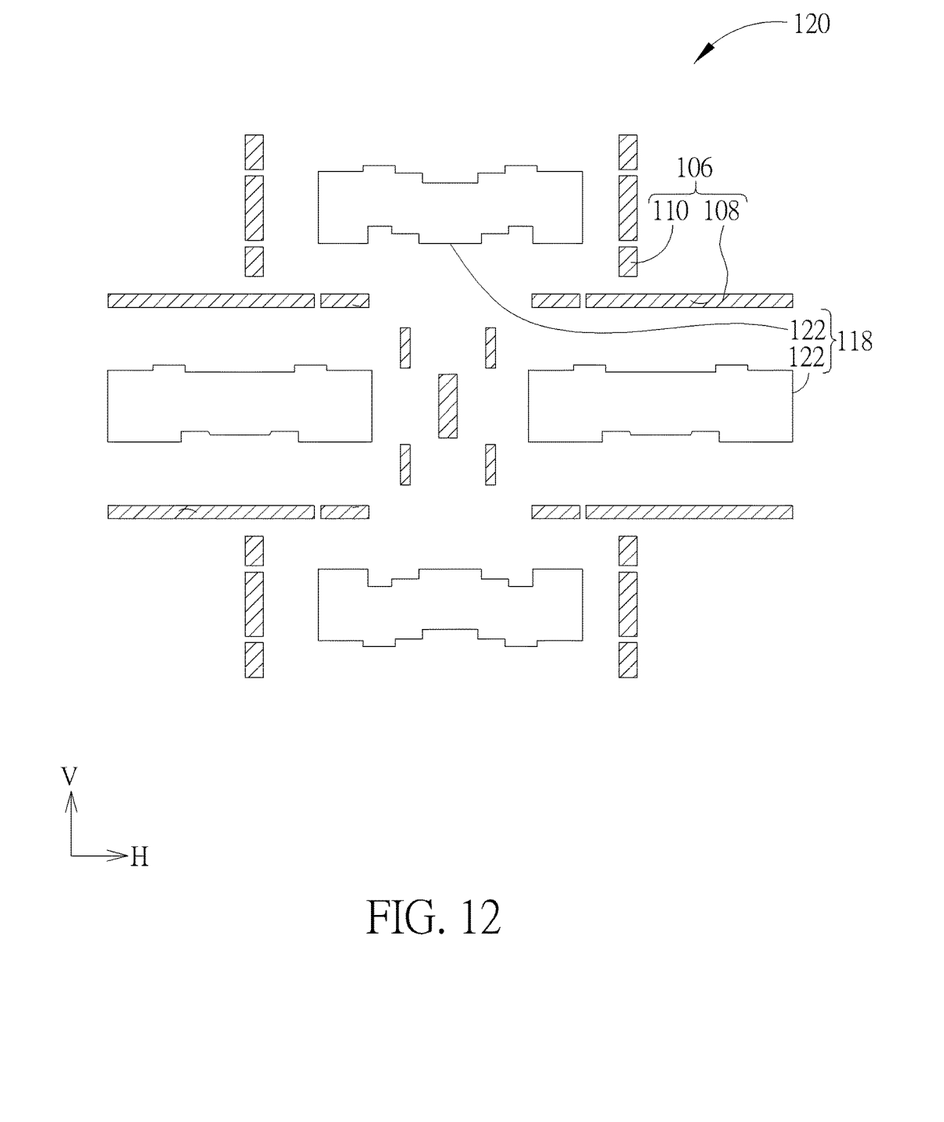

As shown in FIG. 12, an optical proximity correction (OPC) process is then performed with reference to both the first layout pattern 102 and the assist feature pattern 106 to the second layout pattern 116 by the computer system without altering the assist feature pattern 106 in step S14 so as to correct the line width, the line end or the corner of each of the patterns of the first layout pattern 102 in the second layout pattern 116. Accordingly, the first layout pattern 102 can be modified to be a corrected first layout pattern 118, and a third layout pattern 120 can be formed. Specifically, the line width, the line end and the corner of each of the patterns 104 are corrected to be the corrected patterns 122 so as to increase the correctness of the corrected first layout pattern 118 transferred on the material layer on the semiconductor wafer. Thereafter, the third layout pattern 120 is output to form the photomask of this embodiment in step S16. It should be noted that a layout position, a layout dimension and/or a layout shape of the assist feature pattern 106 remains the same during the optical proximity correction process, so that the assist feature pattern 106 in the third layout pattern 120 can be still symmetric. Thus, it is easy to inspect a defect on the formed photomask by finding two different patterns and to verify the accuracy of the formed semiconductor devices on the semiconductor wafer.

As the above-mentioned description, in the present invention, the method of forming the photomask can generate the symmetric assist feature pattern in the second layout pattern, and the assist feature pattern is not altered during the OPC process, so that the assist feature pattern can be still symmetric. Accordingly, the inspection of a defect on the formed photomask and the verification of the accuracy of the formed semiconductor devices on the semiconductor wafer can be easily done.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a photomask, comprising:
providing a first layout pattern to a computer system, the first layout pattern comprises a plurality of patterns;
generating an assist feature pattern by the computer system based on the first layout pattern, and adding the assist feature pattern into the first layout pattern to form a second layout pattern, wherein generating the assist feature pattern comprises:
generating a plurality of first lines, each of the first lines being respectively disposed at a center of a gap between any two of the patterns adjacent to each other, wherein each of the first lines is parallel to sides of the any two of the patterns, and a spacing between each of the first lines and one of the any two of the patterns is the same as another spacing between each of the first lines and another one of the any two of the patterns;
generating a plurality of second lines, each of the second lines being disposed another center of another gap between each of the first lines and a corresponding one of the patterns respectively; and
generating a plurality of a third lines, each of the third lines being disposed another center of another gap between a corresponding one of the patterns and a corresponding one of the second lines and another center of another gap between the corresponding one of the second lines and a corresponding one of the first lines respectively;
performing an optical proximity correction process with reference to both the first layout pattern and the assist feature pattern to the first layout pattern of the second layout pattern without altering the assist feature pattern to form a corrected first layout pattern by the computer system, so as to form a third layout pattern comprising the corrected first layout pattern and the assist feature pattern; and
outputting the third layout pattern to form the third layout pattern on a photomask substrate so as to form a photomask.

2. The method of forming the photomask according to claim 1, wherein generating the assist feature pattern further comprises generating a plurality of assist feature seeds by performing an optical simulation step based on the first layout pattern for equalizing light intensity distribution before generating the first lines.

3. The method of forming the photomask according to claim 2, wherein generating the assist feature pattern further comprises cutting off the first lines, the second lines and the third lines to form a plurality of line segments based on each of the patterns after generating the third lines.

4. The method of forming the photomask according to claim 3, wherein cutting off the first lines, the second lines and the third lines comprises:
forming a plurality of rings respectively based on each of the patterns;
removing corners of each of the rings to form four portions; and
using extension directions of sides of each of the portions as cutting lines to cut off the first lines, the second lines and the third lines.

5. The method of forming the photomask according to claim 3, wherein generating the assist feature pattern further comprises retaining a part of the line segments and removing other part of the line segments after forming the line segments, wherein each of the part of the line segments and the assist feature seeds have an overlapping area.

6. The method of forming the photomask according to claim 5, wherein a ratio of one of the overlapping areas to a corresponding one of the line segments is greater than 0.3.

7. The method of forming the photomask according to claim 5, wherein one of the overlapping areas is ten times greater than a width of a corresponding one of the line segments.

8. The method of forming the photomask according to claim 5, wherein generating the assist feature pattern further comprises merging the line segments spaced apart by a distance smaller than a photomask manufacturing limit and maintaining the line segments spaced apart by another distance greater than the photomask manufacturing limit.

9. The method of forming the photomask according to claim 5, wherein generating the assist feature pattern further comprises removing the assist feature seeds.

10. The method of forming the photomask according to claim 1, wherein the first lines, the second lines and the third lines are not in contact with the patterns.

11. The method of forming the photomask according to claim 1, wherein a length of each of the first lines, the second lines and the third lines is larger than a corresponding side of a corresponding one of the patterns.

12. The method of forming the photomask according to claim 1, wherein generating the first lines further comprises generating a plurality of fourth lines, each of the fourth lines being spaced apart from an outmost one of patterns by a predetermined distance.

13. The method of forming the photomask according to claim 1, wherein the assist feature pattern is symmetrical with respect to a horizontal center line and a vertical center line of the first layout pattern.

14. The method of forming the photomask according to claim 1, wherein a layout position of the assist feature pattern remains the same during the optical proximity correction process.

15. The method of forming the photomask according to claim 1, wherein a layout dimension of the assist feature pattern remains the same during the optical proximity correction process.

16. The method of forming the photomask according to claim 1, wherein a layout shape of the assist feature pattern remains the same during the optical proximity correction process.

* * * * *